United States Patent [19]
Scheidegger et al.

[11] Patent Number: 5,160,889
[45] Date of Patent: Nov. 3, 1992

[54] MAGNETIC RESONANCE METHOD AND DEVICE FOR ACQUIRING SHORT ECHO TIME IMAGES

[75] Inventors: Markus B. Scheidegger, Rüti; Peter Bösiger, Ennetbaden, both of Switzerland

[73] Assignee: U.S. Philips Corporation, New York, N.Y.

[21] Appl. No.: 524,409

[22] Filed: May 16, 1990

[30] Foreign Application Priority Data

Jun. 7, 1989 [EP] European Pat. Off. ........ 89201458.0

[51] Int. Cl.$^5$ ............................................. G01R 33/20
[52] U.S. Cl. ..................................... 324/309; 324/307
[58] Field of Search ............... 324/309, 307, 310, 306, 324/312

[56] References Cited

U.S. PATENT DOCUMENTS

| | | | |
|---|---|---|---|
| 4,791,369 | 12/1988 | Yamamoto et al. | 324/312 |
| 4,814,710 | 3/1989 | McKinnon | 324/309 |
| 4,818,914 | 4/1989 | McKinnon | 324/309 |

FOREIGN PATENT DOCUMENTS

0250050 12/1987 European Pat. Off. .

OTHER PUBLICATIONS

M. A. Foster & J. M. S. Hutchison, "General Principles", Practical NMR Imaging, IRL Press, pp. 14-23 & 28-39.

*Primary Examiner*—Louis Arana

[57] ABSTRACT

A magnetic resonance imaging method for high quality short echo time imaging uses FID-acquired-echoes. Gradient recalled echoes are excited in two short echo time acquisition sequences having opposite polarity reading gradients. Half-echoes for corresponding phase encoding steps are concatenated to reconstructed echoes. An image is reconstructed from the reconstructed echoes using a Fourier transform reconstruction method. With the method artefact free high quality images with echo times below 4 msec can be obtained, even under unfavorable conditions, such as fast blood flow.

17 Claims, 3 Drawing Sheets

MAGNETIC RESONANCE METHOD AND DEVICE FOR ACQUIRING SHORT ECHO TIME IMAGES

FIELD OF THE INVENTION

The invention relates to a magnetic resonance imaging method, in which an object is situated in a stationary homogeneous magnetic field and is subjected to an acquisition sequence for acquiring a magnetic resonance signal from a region of the object, the acquisition sequence comprising an rf-pulse for exciting atomic spins in the object, a phase encoding gradient, and a reading gradient which is reversed for acquiring the magnetic resonance signal, the acquisition sequence being repeated a number of times with a different value of the time integral of the phase encoding gradient.

The invention also relates to a magnetic resonance device comprising means for generating a stationary homogeneous magnetic field, means for exciting rf-pulses, means for generating magnetic field gradients, means for detecting and sampling magnetic resonance signals in an object which is situated in the homogeneous field, control means for controlling the above-noted means, image reconstruction means, and programmed means programmed such that an acquisition sequence for acquiring a gradient recalled echo with a reading gradient is applied to the object.

BACKGROUND OF THE INVENTION

A method and device of this kind are known from the Handbook, "Practical NMR Imaging", M. A. Foster and J. M. S. Hutchinson, 1987, IRL Press, pp. 15–22, and pp. 28–38. A Fourier transform sequence is given at page 19 and a blockdiagram of an NMR imaging device is shown at page 29 of the Handbook. In the method the body is irradiated with an rf-pulse, e.g. a 90° pulse, in the presence of a slice selection gradient, thus flipping atomic spins, such as nuclear spins or with adaptations electron spins, of a slice of the body in a rotating frame rotating with the Larmor frequency by an angle of 90°, resulting in an FID-signal (free induction decay). Then the FID-signal is succesively dephased by a reading gradient having a first polarity and rephased by reversing the reading gradient. During rephasing a so called gradient recalled echo occurs. Two dimensional coding is achieved by applying a variable amplitude phase encoding gradient and by sampling the echo signal. Fourier reconstruction gives a spatially resolved spin distribution of the slice that can be displayed on a monitor as a grey scale image e.g. Extension to 3D-imaging is well known and straight forward so is a modification of the sequence to a so called projection reconstruction sequence. In the sequence the maximum of the echo occurs at a point of time $t_e$ from the center of the pulse at $t_o$. The time difference $t_e - t_o$ is the so called echo time, which may not be chosen too small in case a complete echo is to be sampled. A too small echo time causes echo distortion and eventually image artefacts. In case short echo times are desired, e.g. for Sodium-imaging, for less flow artefacts, or for obtaining a different image contrast, a distorted echo could only be sampled to the echo maximum or so (asymmetric sampling). Ideally the image would be real, and displaying the real part of the image would suffice. But due to inter alia $B_O$-inhomogeneities, susceptibility, eddy currents and flow, the image is not real. Thus, direct real-part reconstruction or, equivalently, data mirroring in k-space often leads to unacceptable image artefacts. Correction methods are known for correcting some of these problems e.g. from the European Patent Application No. 0 250 050, which corresponds to U.S. Pat. No. 4,853,635, giving an iterative correction algorithm. This algorithm needs more than half of the k-space (e.g. $\frac{5}{8}$-th of an echo is sampled), thus restricting echo time reduction. Such correction methods tend to be artefact-sensitive if 50% of the data in k-space is missing, or if the phase varies rapidly over the image in the case of blood flow e.g. Then it would be expedient to acquire data over the whole k-space.

SUMMARY OF THE INVENTION

It is an object of the invention to provide an NMR-imaging method having short echo times and not leading to unacceptable artefacts due to rapid phase variations.

To this end a method according to the invention is characterized in that the object is subjected to a further acquisition sequence differing from the acquisition sequence in having a reading gradient opposite in polarity to the reading gradient of the acquisition sequence, in that the magnetic resonance signals from the acquisition sequences and the further acquisition sequences are sampled starting sampling at least approximately from maxima of the resonance signals giving a first and a second set of samples, in that the samples from the first and second set corresponding to the same value of the time integral are combined to form a reconstructed echo, and in that an image is reconstructed from the reconstructed echoes. Very short echo times without disturbing flow artefacts have been obtained, e.g. in a 1.5 T system between 3 and 4.5 msec with usual imaging parameters. Samples in the center of the k-space are measured twice and an average is formed when combining "half-echoes" to full "pseudo-echoes". As the two readout gradients have opposite signs, so do the flow-induced phase shifts caused by movements in the readout direction. For the k-space-center samples, artefacts are therefore cancelled during reconstruction. This effect is enhanced by the low sensitivity to flow-induced phase shifts of a short $T_E$ sequence.

An embodiment of a method according to the invention is characterized in that before forming a reconstructed echo a first and a second sampling shift are applied to the samples of the first and second set respectively, the first and second sampling shift being obtained from samples from resonance signals acquired with a given value of the time integral by determining shifts of respective first samples to signal maxima. It is thus achieved that unacceptable misalignment of half-echoes is corrected before combining the half-echoes to a reconstructed, complete, echo. The sampling shifts are determined for a zero phase encoding e.g. and may appear to be two or three sampling intervals in practice. For other phase encoding steps the determined sampling shifts are applied before combining half-echoes.

BRIEF DESCRIPTION OF THE DRAWING

The features and advantages of the method and device according to the invention will be more clearly apparent from the following detailed description, in conjunction with the accompanying drawing, wherein.

DESCRIPTION OF THE PREFERRED EMBODIMENT

Figure 1:
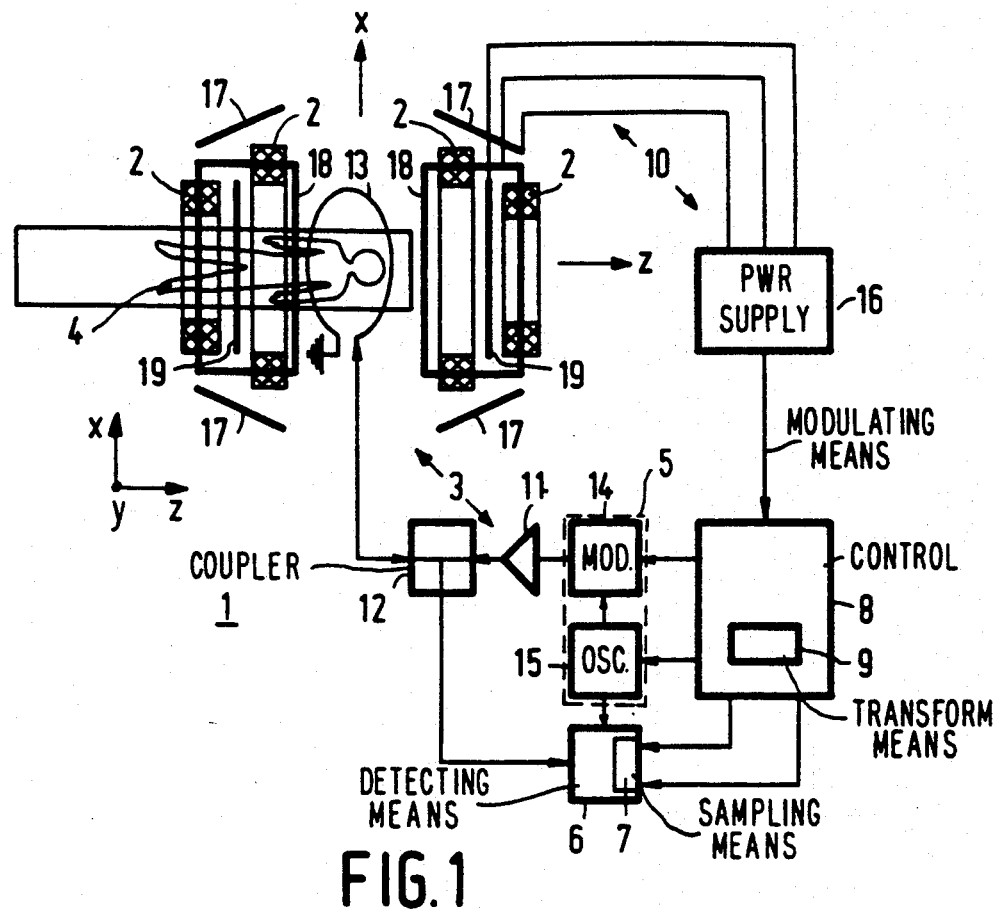
FIG. 1 shows, diagrammatically, a magnetic resonance device for implementing the method according to the invention.

In FIG. 1 there is shown, diagrammatically, a magnetic resonance device 1 according to the invention comprising coil means 2 for generating a stationary homogeneous magnetic field $B_0$, circuit means 3 for producing exciting rf-pulses to be irradiated to an object 4, modulating means 5 for modulating the rf-pulses, detecting means 6 for detecting the excited magnetic resonance signals, sampling means 7 for sampling the magnetic resonance signals and control means 8 for controlling means 3, 5, 6 and 7. The device 1 further comprises Fourier transform (or filtered back-projection) means 9 for reconstructing an image from the sampled magnetic resonance signals, means 10 for generating magnetic field gradients which are superimposed upon the stationary magnetic field. In further detail the means 3 comprise the means 5, a power amplifier 11, a directional coupler 12 and a coil 13. The means 5 comprise a modulator 14 and an oscillator 15. The means 3 generates pulses applied to coil 13 and which excite nuclear spins in the object 4, e.g., a human body, when transmitting the generated rf-pulses. The means 6 receives magnetic resonance signals in response to the generated pulses. The detecting means comprises a quadrature demodulator and the sampling means 7 comprises two A/D-converters giving quadrature detected samples of respective sin and cos components of the detected magnetic resonance signal. The means 10 comprises a power supply 16 to be controlled by the control means 8, for separately controlling gradient magnet coils 17, 18 and 19 for respective generation of magnetic field gradients $G_x$, $G_y$ and $G_z$. The gradient magnet coils may be arranged such that the field direction of the magnetic field gradient coincides with the direction of the stationary homogeneous magnetic field of coil means 2 and that the directions of the gradients are mutually perpendicular, indicated with mutually perpendicular axes x, y and z. If the device 1 is put into operation and the object 4 is placed inside the magnet coils 2 a small excess of nuclear spins (of nuclei having a magnetic moment) will be directed into the direction of the stationary homogeneous magnetic field, which can be considered macroscopically as a magnetization M, an equilibrium magnetization. For a more detailed description of an MRI device and a general description of the principles of MRI reference is made to the aforementioned Handbook, "Practical NMR Imaging".

Figure 2:
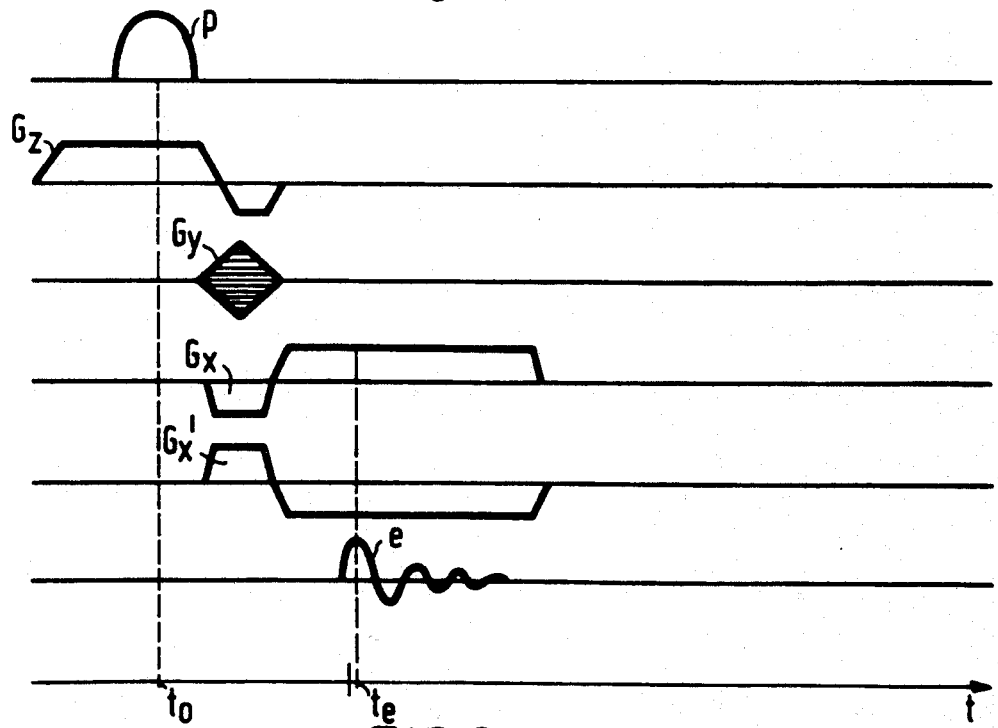
FIG. 2 shows a pulse sequence according to the invention.

In FIG. 2 there is shown a pulse sequence according to the invention as a function of time t. At the instant $t=t_0$ an rf-pulse p is generated with means 3 and the resultant field produced by coil 13 is irradiated to the object 4. For selecting a part of the object 4 (a slice perpendicular to the z-axis e.g.) a selection gradient $G_z$ is applied during the rf-pulse p by means of the gradient magnet coil 19. The rf-pulse p selectively rotates a magnetization (90° or less). A magnetization in the xy-plane (transverse magnetization) gives an FID-signal (not shown). A phase encoding gradient $G_y$ is applied after the rf-pulse p by means of the gradient magnet coil 18 for phase encoding nuclear spins in the part of the object. During the gradient $G_y$ also a reading gradient $G_x$ is applied by means of the gradient coil 17 for dephasing the spins. Thereafter the reading gradient $G_x$ is reversed giving a recalled FID at the instant $t=t_e$, an echo e. The echo e is quadrature detected and sampled by means of two A/D converters, so that real and imaginary signal components are acquired. The acquisition sequence is repeated for different values of the time integral of the phase encoding gradient $G_y$. The samples are stored, building up a first set of samples. A further acquisition sequence is applied being identical to the described sequence but for the gradient $G_x$. A gradient $G_x$ therein is opposite in polarity to the gradient $G_x$. The samples acquired with the further acquisition sequence are stored and build up a second set of samples. Samples from the first and second set are combined to form a reconstructed echo. By means of the Fourier transform means 9 a two dimensional Fourier transform is carried out on the combined sets for obtaining a spin-density distribution. The spin-density distribution is displayed as a grey scale image e.g. on a monitor (not shown).

Figure 3A:
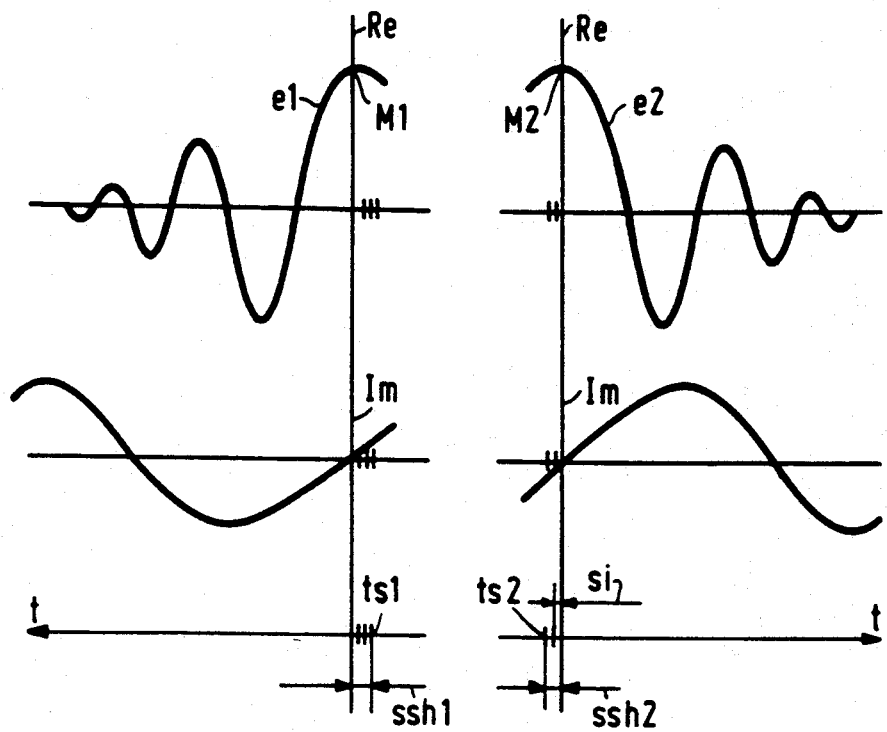
FIG. 3A, 3B and 3C show combination of half echoes to a reconstructed echo in detail.
Figures 3B, 3C:
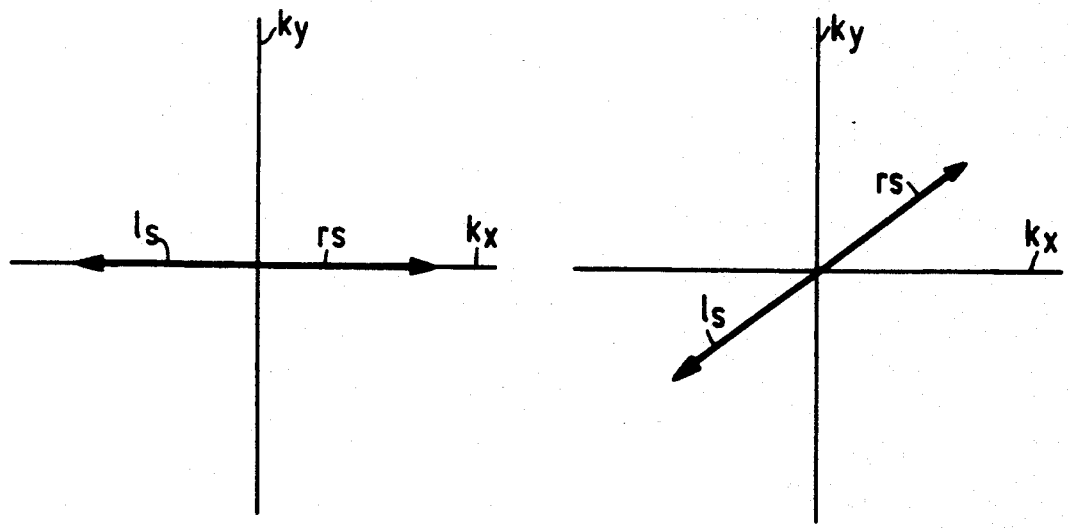

In FIG. 3A, 3B and 3C combination of half-echoes to a reconstructed echo is shown in detail. FIG. 3A shows real Re and imaginary Im parts of half-echoes e1 and e2 acquired with the acquisition sequences as a function of time t. Before combining the half-echoes e1 and e2 to a reconstructed echo a first and a second sampling shift ssh1 and ssh2 are determined with respect to actual first samples ts1 and ts2. The sampling shifts ssh1 and ssh2 are determined from maximum moduli of samples around the signal maxima M1 and M2 respectively. Typically the sampling shifts ssh1 and ssh2 are in the order of 2-3 sampling intervals si. The sampling shifts ssh1 and ssh2, determined for a zero phase encoding e.g., are applied for all other phase encoding steps. The first order phase correction prior to concatenating the half-echoes (FID-acquired-echoes) to a reconstructed echo ensures that symmetric reconstructed echoes are obtained, otherwise artefacts for lower spatial frequencies would occur. In FIG. 3B wherein k-space ($k_x k_y$) is shown it is achieved that k-space is scanned symmetrically, shown for $G_y=0$ for a right scan rs and a left scan ls. In practical situations omitting phase correction would cause asymmetrical k-space scanning. In FIG. 3C a similar situation is shown when applying projection reconstruction sequences. With the method according to the invention very short echo times can be achieved. It should be noted that were there no phase errors (which does not hold in practice, generally) short echo times could also be achieved from right half k-space data e.g., but the modulus reconstruction could not be applied. Phase errors would lead to unacceptable image artefacts in practical situations when using only right half k-space data. The method according to the invention has been implemented on a whole body 1.5 T system. For a field of view of 250 mm, a 256×256 pixel matrix (giving a 1 mm image resolution), and a slice thickness of 5 mm, in a 2D-FT or 3D-FT fast imaging sequence echo times between 3.0 and 4.5 msec were obtained. For small sequence repetition times (e.g. <100 msec) an opposite $G_y$ gradient and for spurious FID suppression a constant dephasing gradient $G_x$ (repetition times <200 msec) were applied after signal sampling. Images have been made of a human head using head coils or heart images using a whole body coil. In a multiple slice version together with gating and a sequence repetition time of 30 msec a heart movie was made with an image frequency of 32 images per second for the same slice. Flow images can be made when displaying a phase image instead of a modulus image. It should be noted that the order of acquisition of the signals for the first and second set can be chosen freely but it is advantageous to acquire signals with opposite reading gradients consecutively. It should further be noted that the acquisition sequences may be modified, the invention being applicable to many variants of the described sequence, so the sequences may constitute a multiple-echo sequence e.g.

Figure 4:
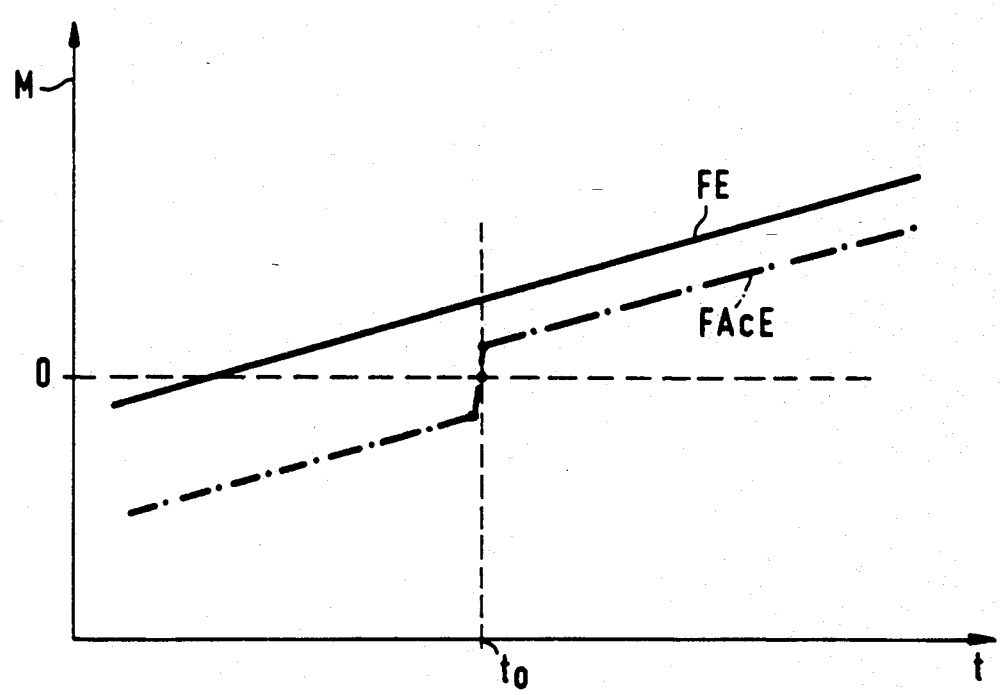
FIG. 4 shows phase shifts induced by flowing spins in readout direction.

FIG. 4 shows phase shifts induced by flowing spins in readout direction for conventional sequences such as fast imaging (FE) and according to present invention (FAcE) as a function of time t with respect to $M=0$ of the first moment M of the readout gradient during the sampling period and with respect to the echo maximum at $t=t_O$. As in present invention the two readout gradients have opposite signs, so do the flow-induced phase shifts caused by movements in the readout direction. For the k-space-center samples, artefacts are therefore cancelled during reconstruction. Experiments with flow compensated fast image sequences and sequences according to the present invention show superior artefact suppression. Due to this high flow-artefact suppression, in-vivo images display very fine branching vessels in the brain, and also lung vessels.

What is claimed is:

1. A magnetic resonance imaging method, in which an object to be imaged is in a stationary homogeneous magnetic field and is subjected to an acquisition sequence for acquiring a magnetic resonance signal, said method comprising:
   a) generating a first acquisition sequence comprising:
      generating an rf-pulse for exciting atomic spins in the object;
      generating a phase encoding gradient;
      generating a first reading gradient having a first portion reversed in polarity from a second portion; and
      repeating the acquisition sequence a number of times with a different value of the time integral of the phase encoding gradient; and
   b) generating a further acquisition sequence comprising:
      generating a sequence differing from the first acquisition sequence by generating a reading gradient opposite in polarity to said first reading gradient;
      sampling magnetic resonance signals from the first and further acquisition sequences by starting the sampling at least approximately from the maxima of the resonance signals to produce a first and a second set of samples;
      combining the samples from the first and second set corresponding to the same value of said time integral to form a reconstructed echo; and
      reconstructing an image from the reconstructed echoes.

2. The magnetic resonance imaging method of claim 1 including before forming a reconstructed echo, determining first and second sampling shifts of the respective first and second sets of samples relative to signal maxima from samples of resonance signals acquired with a given value of said time integral.

3. The magnetic resonance imaging method of claim 2 including flow imaging the object in the direction of the reading gradient.

4. The magnetic resonance imaging method of claim 2 including determining the shifts to signal maxima from moduli of samples adjacent to the signal maxima.

5. The magnetic resonance imaging method of claim 4 including flow imaging the object in the direction of the reading gradient.

6. Magnetic resonance imaging method according to claim 4 wherein said acquisition sequences are modified to projection reconstruction sequences.

7. Magnetic resonance imaging method according to claim 2 wherein said acquisition sequences are modified to projection reconstruction sequences.

8. Magnetic resonance imaging method according to claim 2 including flow imaging the object in the direction of the reading gradient.

9. The magnetic resonance imaging method of claim 1 including flow imaging the object in the direction of the reading gradient.

10. Magnetic resonance imaging method according to claim 1, 2 or 4 wherein the image is reconstructed as a modulus image.

11. Magnetic resonance imaging method according to claim 10, wherein said acquisition sequences are modified to projection reconstruction sequences.

12. Magnetic resonance imaging method according to claim 10 used for flow imaging, especially for flow in the direction of the reading gradient.

13. Magnetic resonance imaging method according to claim 1, 2 or 4 wherein said acquisition sequences are modified to projection reconstruction sequences.

14. Magnetic resonance imaging method according to claim 13 used for flow imaging, especially for flow in the direction of the reading gradient.

15. Magnetic resonance imaging device comprising:
   means for generating a stationary homogeneous magnetic field;
   means for exciting rf pulses;
   means for generating magnetic field gradients;
   means for detecting and sampling magnetic resonance signals obtained in an object which is situated in the homogeneous field; and
   control means for providing a first acquisition sequence for acquiring a gradient recalled echo from said object with a reading gradient of a given polarity and for providing a second acquisition sequence for acquiring a further gradient recalled echo with a reading gradient opposite in polarity to said reading gradient given polarity, said control means including means for combining samples at least approximately starting from the maxima of the resonance signals of the respective sequences to form a reconstructed echo and means for reconstructing an image from the reconstructed echoes.

16. The magnetic resonance device of claim 15 including means for flow imaging the object in the direction of the reading gradient.

17. The magnetic resonance imaging device of claim 15 wherein said reading gradients each have a first portion of a first polarity and a second portion of a second polarity different than the first polarity.

* * * * *